(12) United States Patent
Voinigescu et al.

(10) Patent No.: US 10,454,591 B2
(45) Date of Patent: Oct. 22, 2019

(54) TRACK AND HOLD AMPLIFIERS

(71) Applicant: Finisar Corporation, Sunnyvale, CA (US)

(72) Inventors: Sorin Petre Voinigescu, Scarborough (CA); Konstantinos Vasilakopoulos, Toronto (CA)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 15/601,639

(22) Filed: May 22, 2017

(65) Prior Publication Data

US 2017/0338894 A1 Nov. 23, 2017

Related U.S. Application Data

(60) Provisional application No. 62/339,277, filed on May 20, 2016.

(51) Int. Cl.
  *H04B 10/69* (2013.01)
  *G11C 27/02* (2006.01)
  *H03F 3/45* (2006.01)

(52) U.S. Cl.
  CPC ....... *H04B 10/6933* (2013.01); *G11C 27/026* (2013.01); *H03F 3/45085* (2013.01); *H03F 3/45278* (2013.01); *H03F 3/45291* (2013.01); *H04B 10/69* (2013.01); *H03F 2203/45144* (2013.01); *H03F 2203/45396* (2013.01); *H03F 2203/45722* (2013.01)

(58) Field of Classification Search
  CPC .................................................. G11C 27/026
  See application file for complete search history.

(56) References Cited

U.S. PATENT DOCUMENTS

| | | | |
|---|---|---|---|
| 5,130,572 A * | 7/1992 | Stitt | G11C 27/026 327/96 |
| 6,472,908 B1 * | 10/2002 | Smetana | H03F 3/45089 327/52 |

(Continued)

OTHER PUBLICATIONS

Timothy D. Gathman, A 30GS/s Double-Switching Track-and-Hold Amplifier with 19dBm IIP3 in an InP BiCMOS Technology, IEEE Xplore: Mar. 6, 2014, Date of Conference: Feb. 9-13, 2014, pp. 500-501.*

(Continued)

*Primary Examiner* — Omar S Ismail
(74) *Attorney, Agent, or Firm* — Maschoff Brennan

(57) ABSTRACT

An embodiment includes a track and hold amplifier device. A device may include an emitter follower transistor coupled to each of an input and an output. The device may also include a charging node coupled between the output and a voltage supply, wherein the charging node is also coupled to the input via the emitter follower transistor. Further, the device may include a cascode switch coupled to each of the input and the output. The cascode switch may be configured to cause the emitter follower transistor to operate in a conductive state and charge the charging node during a track mode. The cascode switch may also be configured to cause the emitter follower transistor to operate in a non-conductive state to isolate the charging node from the input during a hold mode. The cascode switch may include a MOS-HBT transistor combination operating in class AB mode.

20 Claims, 6 Drawing Sheets

(56) References Cited

U.S. PATENT DOCUMENTS

| | | | | |
|---|---|---|---|---|
| 9,030,256 B2* | 5/2015 | Jones | .................... | H03F 1/0227 |
| | | | | 330/127 |
| 2003/0219260 A1* | 11/2003 | Chiou | .................... | H03F 3/087 |
| | | | | 398/202 |
| 2008/0218257 A1* | 9/2008 | Lee | ...................... | G11C 27/026 |
| | | | | 327/561 |
| 2012/0049894 A1* | 3/2012 | Berchtold | ............ | G11C 27/024 |
| | | | | 327/94 |

OTHER PUBLICATIONS

Timothy D. Gathman.A 30GS/S Double-Switching Track-and-Hold Amplifier with 19dBm MP3 in an InP BiCMOS Technology, IEEE Xplore: Mar. 6, 2014, Date of Conference: Feb. 9-13, 2014, pp. 500-501.*

* cited by examiner

TRACK AND HOLD AMPLIFIERS

CROSS-REFERENCE TO RELATED APPLICATIONS

A claim for benefit of priority to the May 20, 2016 filing date of the U.S. Patent Provisional Application No. 62/339,277, titled "TRACK AND HOLD AMPLIFIERS" (the '277 Provisional Application), is hereby made pursuant to 35 U.S.C. § 119(e). The entire disclosure of the '277 Provisional Application is hereby incorporated herein.

FIELD

The embodiments discussed herein are related to track and hold amplifiers. In particular, some embodiments relate to track and hold amplifiers including a switched emitter-follower topology.

BACKGROUND

Track and hold amplifiers, which may be used within, for example, analog-to-digital converters, may generate a discrete-time analog signal from a continuous-time analog signal. In a track mode, an analog input signal may be received at a storage node and an output signal tracks the input signal. In a hold mode, the storage node holds the value of the input signal and the output signal is held substantially constant at the level of the input signal.

The subject matter claimed herein is not limited to embodiments that solve any disadvantages or that operate only in environments such as those described above. Rather, this background is only provided to illustrate one example technology area where some embodiments described herein may be practiced.

SUMMARY

An example embodiment includes a track and hold amplifier device. The device may include an emitter follower transistor coupled to each of an input and an output. The device may also include a charging node coupled between the output and a voltage supply, wherein the charging node is also coupled to the input via the emitter follower transistor. Further, the device may include a cascode switch coupled to each of the input and the output. The cascode switch may be configured to cause the emitter follower transistor to operate in a conductive state and charge the charging node during a track mode. The cascode switch may also be configured to cause the emitter follower transistor to operate in a non-conductive state to isolate the charging node from the input during a hold mode.

Another example embodiment includes an optical receiver. The optical receiver includes an analog-to-digital converter and a track and hold amplifier coupled to the analog-to-digital converter. The track and hold amplifier includes an emitter follower transistor coupled to each of an input of the track and hold amplifier and an output of the track and hold amplifier. The track and hold amplifier may also include a charging node coupled between the output and a voltage supply. The charging node is also coupled to the input via the emitter follower transistor. The track and hold amplifier may also include a cascode switch coupled to each of the input and the output. The track and hold amplifier may be configured to cause the emitter follower transistor to operate in a conductive state and charge the charging node during a track mode. Moreover, the track and hold amplifier may be configured to cause the emitter follower transistor to operate in a non-conductive state to isolate the charging node from the input during a hold mode.

In accordance with another embodiment, a device includes a plurality of emitter follower transistors, wherein each emitter follower transistor of the plurality of emitter follower transistors is coupled to each of an input and an output. The device may also include a plurality of charging nodes coupled to the output, wherein each charging node of the plurality of charging nodes is also coupled to the input via at least one emitter follower transistor of the plurality of emitter follower transistors. In addition, the device may include a plurality of cascode switches, wherein each cascode switch of the plurality of cascode switches is coupled to each of the input and the output. Each cascode switch of the plurality of cascode switches may be configured to cause an emitter follower transistor of the plurality of emitter follower transistors to operate in a conductive state and charge a charging node of the plurality of charging nodes during a track mode. Each cascode switch of the plurality of cascode switches may further be configured to cause the emitter follower transistor to operate in a non-conductive state to isolate the charging node from the input during a hold mode.

According to another embodiment, the present disclosure includes methods for operating a track and hold amplifier. Various embodiments of such a method may include receiving an input signal at an input coupled to an emitter follower transistor. The method may also include configuring a cascode switch to cause the emitter follower transistor to operate in a conductive state to couple the input to each of a charging node and an output during a track mode. Further, the method may include configuring the cascode switch to cause the emitter follower transistor to operate in a non-conductive state to isolate the input from each of the charging node and the output during a hold mode.

The object and advantages of the embodiments will be realized and achieved at least by the elements, features, and combinations particularly pointed out in the claims. Both the foregoing general description and the following detailed description are exemplary and explanatory and are not restrictive.

BRIEF DESCRIPTION OF THE DRAWINGS

Example embodiments will be described and explained with additional specificity and detail through the use of the accompanying drawings in which.

DESCRIPTION OF SOME EXAMPLE EMBODIMENTS

The present disclosure relates to track and hold amplifiers (THAs) including aswitched-emitter follower (SEF) topology. Unlike traditional SEF THA topologies, embodiments of the present disclosure include a quasi-current mode logic (CML) metal-oxide-semiconductor-heterojunction bipolar transistor (MOS-HBT) cascode differential switch. The quasi-CML MOS-HBT switch, which may be faster than complementary metal-oxide-semiconductor (CMOS) or n-type metal-oxide-semiconductor field-effect transistor (MOSFET) switches, may operate with lower supply voltages compared to bipolar-only CML switches. The MOS-HBT cascade differential switch may take advantage of the low input time constant of the MOS device, which can be minimized through appropriate layout techniques. Further, the low output time constant of the HBT may help achieve comparable, or faster operation, relative to bipolar-only CML switches. In one embodiment, one or more THAs, in accordance with various embodiments, may be used with (e.g., within) an analog-to-digital converter with input bandwidths exceeding, for example, 30 GHz, as needed in future fiber optic communication systems and instrumentations.

To minimize parasitic capacitances (e.g., at very high frequencies), a compact layout of a THA may be of paramount importance. According to various embodiments, active devices of the THA may be placed at minimum distances from each other. Further, hold capacitors may be formed as metal insulator metal (MIM) capacitors in the upper layers of a metal stack to reduce substrate noise coupling. Relatively small feed-forward capacitors, which may reduce clock feedthrough, may be implemented by overlapping metal stripes in the top of two metal layers. However, these feed-forward capacitors may be removed to improve bandwidth.

Some additional details of these and other embodiments are described with reference to the appended figures. In the appended figures, structures and features with the same item numbers are substantially the same unless indicated otherwise.

Figure 1:
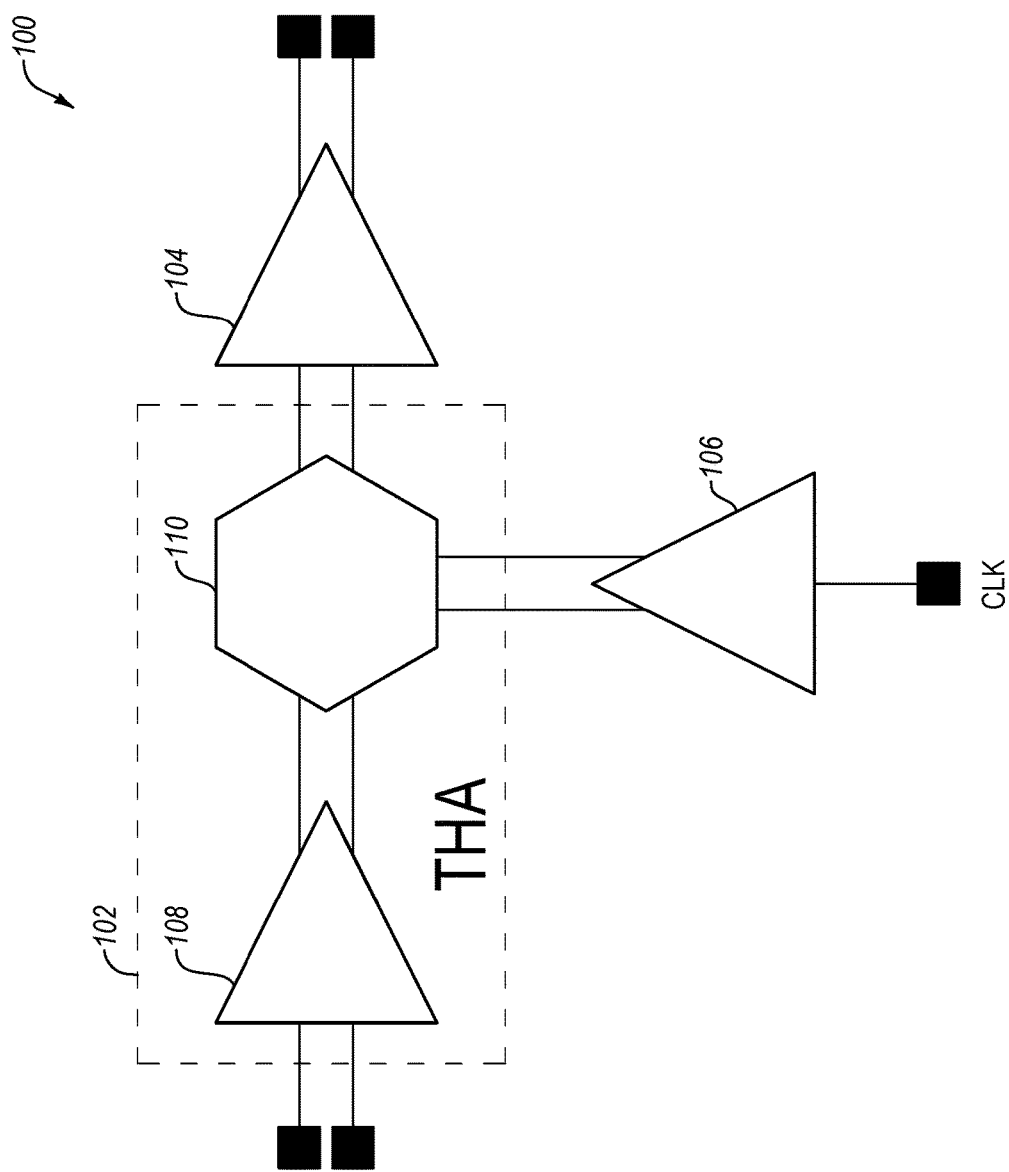
FIG. 1 is a block diagram of a device including a track and hold amplifier.

FIG. 1 is a block diagram of a device 100 including a track and hold amplifier (THA) 102. Device 100 further includes an output driver 104 and a clock amplifier 106. Output driver 104 may include, for example only, a linear 50 Ohm output driver, and clock amplifier 106 may include, for example only, a DC-108 GHz clock amplifier.

THA 102 may include an input buffer 108, which may include, for example, a linear input buffer. THA 102 may also include a THA core 110.

Figure 2:
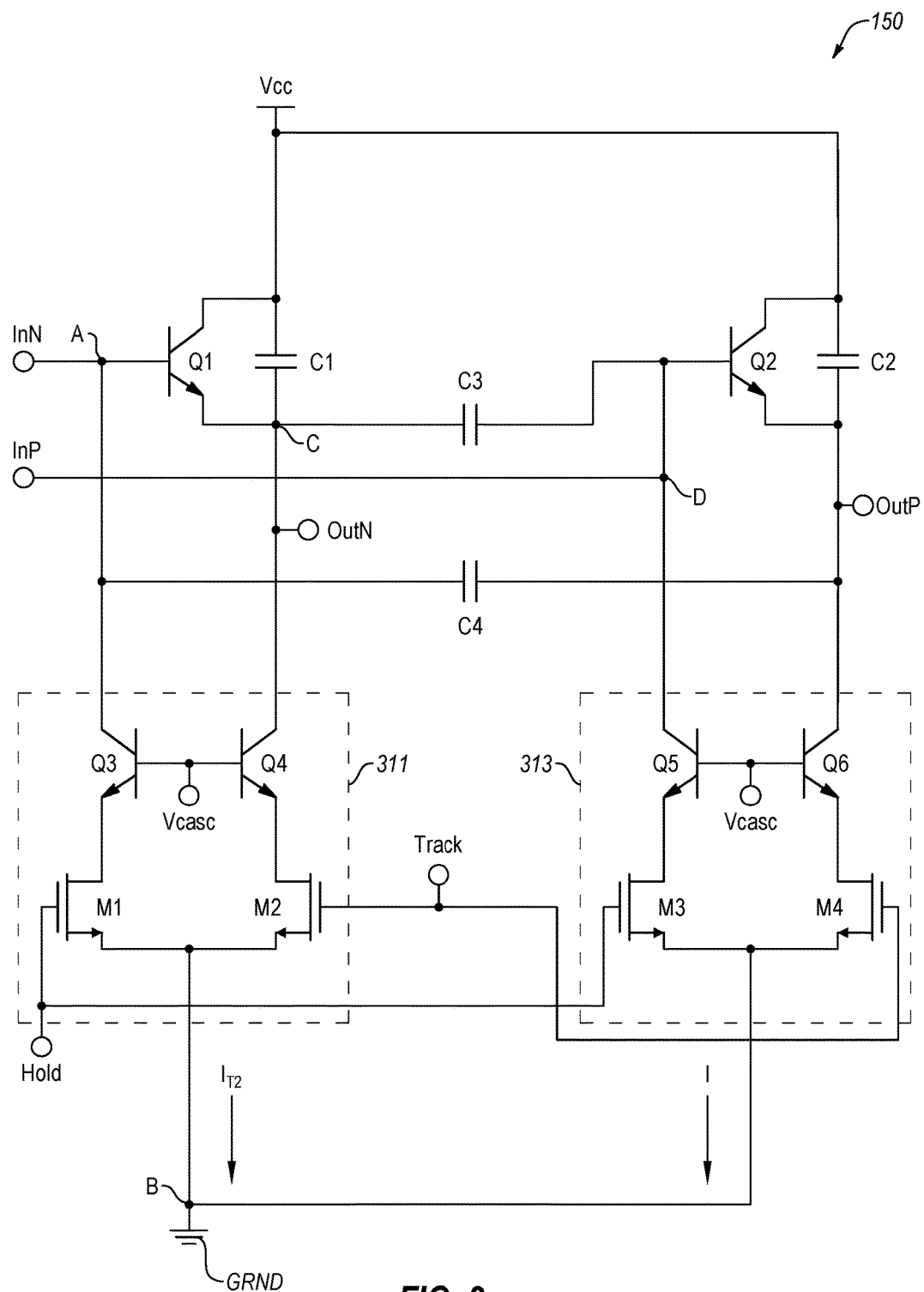
FIG. 2 is a circuit diagram of an example track and hold amplifier core.

FIG. 2 is a circuit diagram of an example THA core 150. For example only, THA core 110 of FIG. 1 may comprise THA core 150. THA core 150 includes a differential input including a first input InN and a second input InP and a differential output including a first output OutN and a second output OutP. THA core 150 also includes transistors Q1-Q6, transistors M1-M4, capacitors C1-C4, a voltage supply Vcc, and a ground GRND. It is noted that although FIG. 2 depicts capacitors C1-C4, the THA core may include any suitable energy storage elements.

According to at least one embodiment, transistors Q1-Q6 may comprise bipolar transistors. For example only, transistors Q1-Q6 may comprise 0.1 um×2 um transistors. Further, transistors M1-M4 may comprise MOSFETs (e.g., N-channel field-effect transistors (FETs)). For example only, transistors M1-M4 may comprise 12×55 nm×0.8 um transistors.

According to various embodiments, THA core 150 includes a MOS-HBT cascode differential switch including a cascode switch 311 and a cascode switch 313. As illustrated, cascode switch 311 includes transistors Q3, Q4, M1, and M2, and cascode switch 313 includes transistors Q5, Q6, M3, and M4.

By way of example, voltage supply Vcc may comprise a 2.5 V voltage supply with a maximum differential input voltage of, for example only, 600 mVpp. In at least one embodiment, a bandwidth may exceed 50 GHz including an input buffer and a linear output driver (e.g., input buffer 108 and output driver 104 of device 100 shown in FIG. 1) capable of driving, for example 50 Ohm loads. By way of example only, a maximum sampling rate may comprise 75 GS/s and the power consumption of THA core 150 may be substantially 42.5 mW.

In one specific embodiment, as illustrated in FIG. 2, a collector of transistor Q3 is coupled to a node A, which is further coupled to input InN and a base of transistor Q1. A base of transistor Q3 is coupled to a base of transistor Q4, and a base of transistor Q5 is coupled to a base of transistor Q6. Each of transistors Q3-Q6 is configured to receive a bias voltage Vcasc at its base.

An emitter of transistor Q3 is coupled to a drain of transistor M1. A source of transistor M1 is coupled to a node B, which is further coupled to sources of transistors M2-M4 and a ground GRND. A gate of transistor M1 and a gate of transistor M3 are each configured to receive a hold signal, and the gates of transistors M2 and M4 are configured to receive a track signal. An emitter of transistor Q4 is coupled to a drain of transistor M2, and a collector of transistor Q4 is coupled to an output OutN, which is further coupled to a node C. Node C is further coupled to an emitter of transistor Q1. An emitter of transistor Q5 is coupled to a drain of transistor M3, and a collector of transistor Q5 is coupled to a node D. Node D is further coupled to input InP, which is also coupled to a base of transistor Q2. An emitter of transistor Q6 is coupled to a drain of transistor M4, and a collector of transistor Q6 is coupled to an output OutP. Output OutP is further coupled to an emitter of Q2. Collectors of transistors Q1 and Q2 are coupled to voltage supply Vcc.

Further, capacitor C1 is coupled between the emitter of transistor Q1 and the collector of transistor Q1, and capacitor C2 is coupled between the emitter of transistor Q2 and the collector of transistor Q2. Capacitors C1 and C2 may also be referred to herein as "charging nodes," "hold capacitors," or "charging capacitors." As non-limiting examples, each of capacitor C1 and C2 may comprise 60 fF. Capacitor C3 is coupled between node C and base of transistor Q2, and capacitor C4 is coupled between node A and output OutP. Capacitors C3 and C4 may also be referred to herein as "feedforward capacitors." As non-limiting examples, each of capacitor C3 and C4 may comprise 10 fF. In other embodiments, capacitors C3 and C4 may be removed to improve the bandwidth.

For example only, during a contemplated operation of THA core 150, a voltage at inputs InN and InP may comprise 2 V, a current through each of transistors Q3-Q6 may comprise substantially 2.45 mA, a voltage at the bases of each of transistors Q3-Q6 may comprise 1.54 V, and a voltage at outputs OutN and OutP may comprise 1.16 V.

Figure 3:
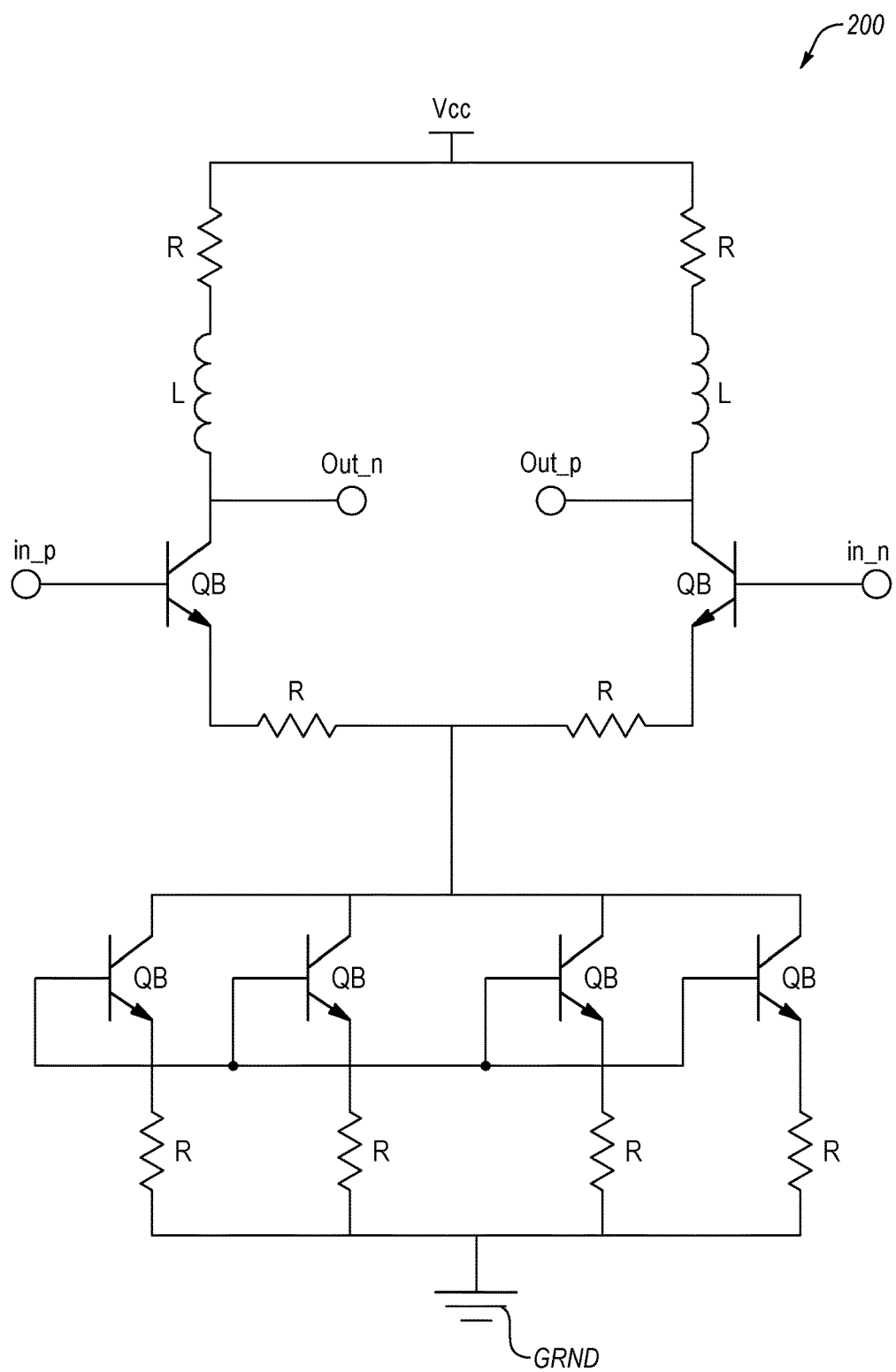
FIG. 3 depicts an example buffer that may be coupled to a track and hold amplifier.

FIG. 3 is an example linear buffer 200. For example only, input buffer 108 of FIG. 1 may comprise buffer 200. Buffer 200 includes differential inputs in_p and in_n, and differential outputs out_p and out_n. In one embodiment, differential outputs out_p and out_n of buffer 200 may be coupled to differential inputs InP and InN of THA core 150 (see FIG. 2). Buffer 200 further includes transistors QB, inductors L, resistors R, voltage supply Vcc, and ground GRND. Buffers are well known in the art, and therefore, buffer 200 will not be described in further detail.

Figure 4:
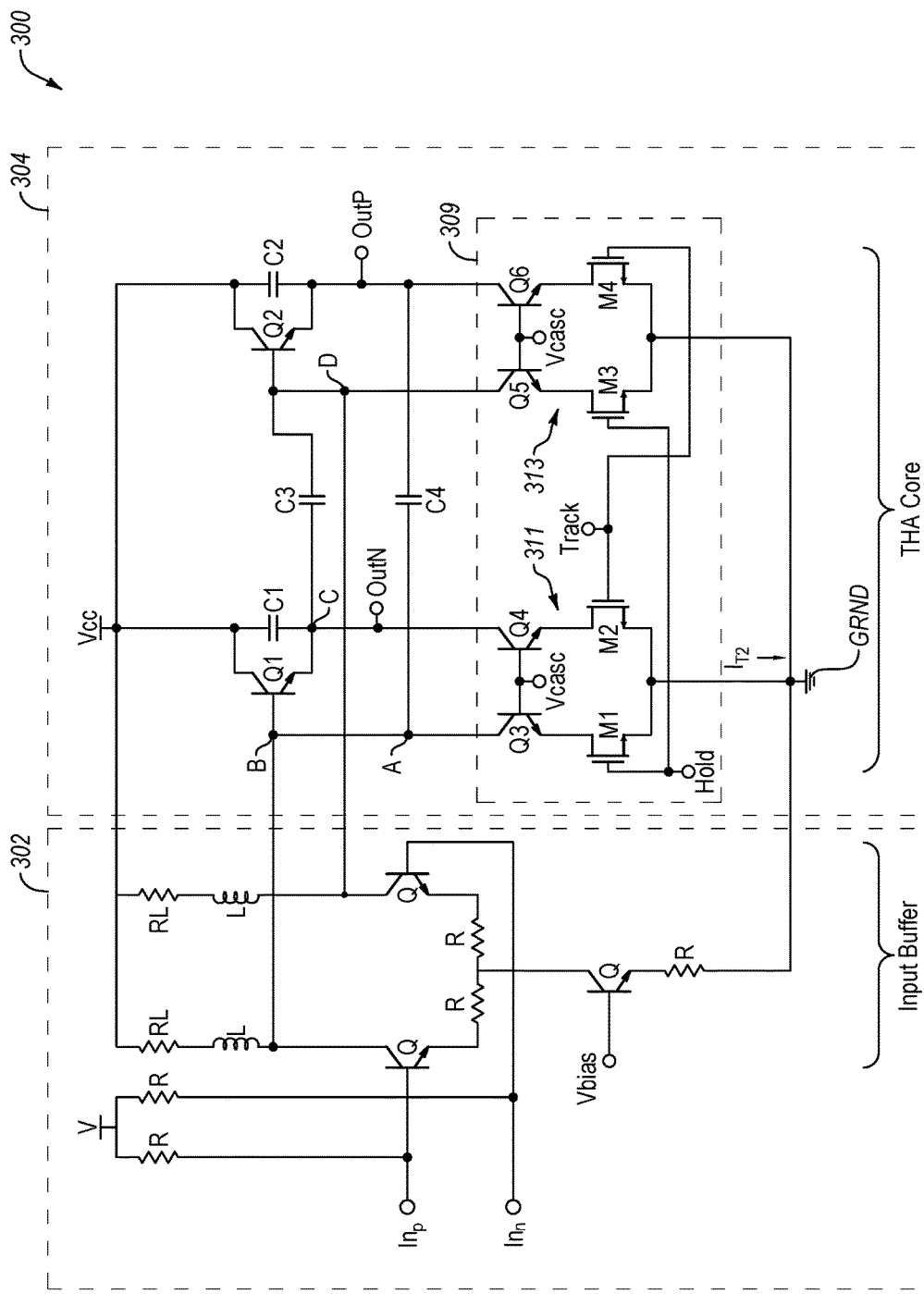
FIG. 4 depicts an example track and hold amplifier including an input buffer and a track and hold amplifier core.

FIG. 4 illustrates an example THA 300. In this embodiment, THA 300 includes an input buffer 302 and a THA core 304. Like THA core 150 of FIG. 2, THA core 304 includes a MOS-HBT cascode differential switch 309 including a cascode switch 311 and a cascode switch 313. As illustrated, cascode switch 311 includes transistors Q3, Q4, M1 and M2, and cascode switch 313 includes transistors Q5, Q6, M3 and M4. THA core 304 further includes transistors Q1 and Q2, storage nodes C1-C4, and outputs OutN and OutP. THA core 304 may include an input coupled to node B and an input coupled to node D. As will be appreciated, THA core 304 may include a switched EF stage with MOS-HBT quasi-CML switch 309 operating in class-AB mode.

During a track mode, a track signal, which is conveyed to a gate of transistor M2 and a gate of transistor M4, is high while a hold signal, which is conveyed to a gate of transistor M1 and a gate of transistor M3, is low. As a result, transistors Q1 and Q2 may be turned on (i.e., operating in a conductive state), acting as emitter followers and charging capacitors C1 and C2. Stated another way, the differential MOS-HBT switch may swing its entire current (e.g., 4 mA) into the emitter follower transistors Q1 and Q2, charge capacitors C1 and C2, and generate an output signal that may track the input signal. It is noted that the accuracy at which THA 300 follows the input signal may depend on the linear input buffer and the linearity of the switch.

In a hold mode, a hold signal, which is conveyed to a gate of transistor M1 and a gate of transistor M3, is high and current may be directed away from the base of emitter follower transistors Q1 and Q2 through transistors M1 and M3. Emitter follower transistors Q1 and Q2 may be turned off (i.e., operating in a non-conductive state) and capacitors C1 and C2 may be isolated from the input signal. When the hold signal is high, a current IT2 may flow through transistor M1 generating an additional voltage drop on load resistor RL of input buffer 302. This voltage drop may lower a base voltage of transistors Q1 and Q2 to a level wherein transistors Q1 and Q2 may be completely turned off.

It is noted that, in at least one embodiment, capacitors C3 and C4 may include overlapping metal stripes in the top two metal layers. This configuration may reduce parasitic coupling to a substrate, minimize layout footprint, and/or increase circuit bandwidth. However, the maximum bandwidth may be obtained if capacitors C3 and C4 are removed from the circuit.

It is further noted that an input buffer (e.g., input buffer 302) may play an important role in the operation of a THA (e.g., THA 304), as it may determine the linearity of THA 304. The input buffer may closely track the input signal while providing a linear gain, as any distortion due to the non-linearity of the input buffer may directly affect the analog value stored on a hold capacitor during the hold mode. A design of the input buffer, and especially the choice of the voltage drop on its load resistor, may impact the performance of the switch (i.e., switch 309) in the hold phase.

As non-limiting examples, THA core 150/304 may exhibit a switching speed of 75 GS/s or faster, an input linear range of substantially 300 mVpp per side, and an input bandwidth of more than 30 GHz. Further, THA core 150/304 may exhibit a 7 bit accuracy, and consume less than 20 mW of power.

Figure 5:
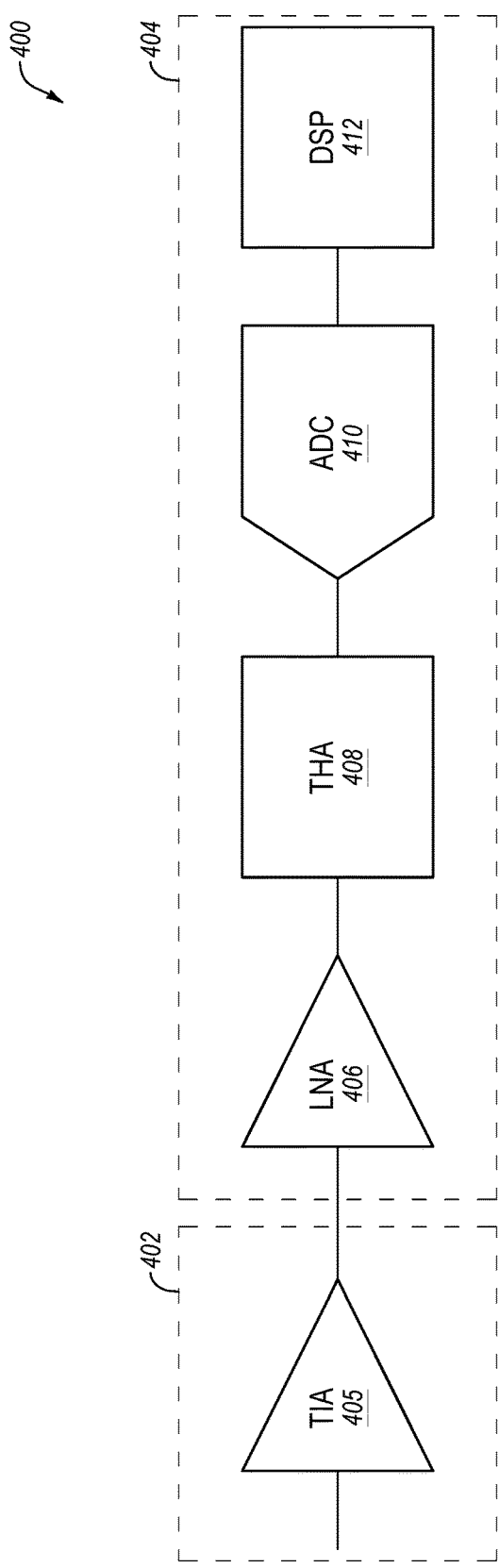
FIG. 5 illustrates an example system including an optical transceiver.

FIG. 5 illustrates an example optical receiver 400 including electro-optics 402 and component 404. While optical receiver 400 is described in some detail below, it is described by way of illustration only, and not by way of limitation.

As illustrated, electro-optics 402 includes a transimpedance amplifier (TIA) 405. Component 404, which may include electronics (e.g., on a silicon chip), includes a low-noise linear amplifier buffer (LNA) 406, a THA 408, an analog-to-digital converter (ADC) 410, and a digital signal processor 412. According to at least one embodiment, THA 408 may include THA core 150 (see FIG. 2), THA core 304 (see FIG. 4), or THA 300 (see FIG. 4).

During a contemplated operation of optical receiver 400, TIA 405 may receive one or more current signals, and output one or more voltage signals to LNA 406. LNA 406 may linearly amplify the one or more voltage signals and convey an output to THA 408, which as described above, may measure an instantaneous value of an input signal, and generate an output signal corresponding to the instantaneous value of the input signal. The output signal value may be held substantially constant, ignoring any further changes in the input signal, until THA 408 is triggered again.

ADC 410 may receive an output of THA 408 and convert the received analog signal to a digital signal. The digital signal may be conveyed to digital signal processor 412, which may perform one or more processing operations.

Modifications, additions, or omissions may be made to FIG. 5 without departing from the scope of the present disclosure. For example, optical receiver 400 may include more or fewer elements than those illustrated and described in the present disclosure.

Figure 6:
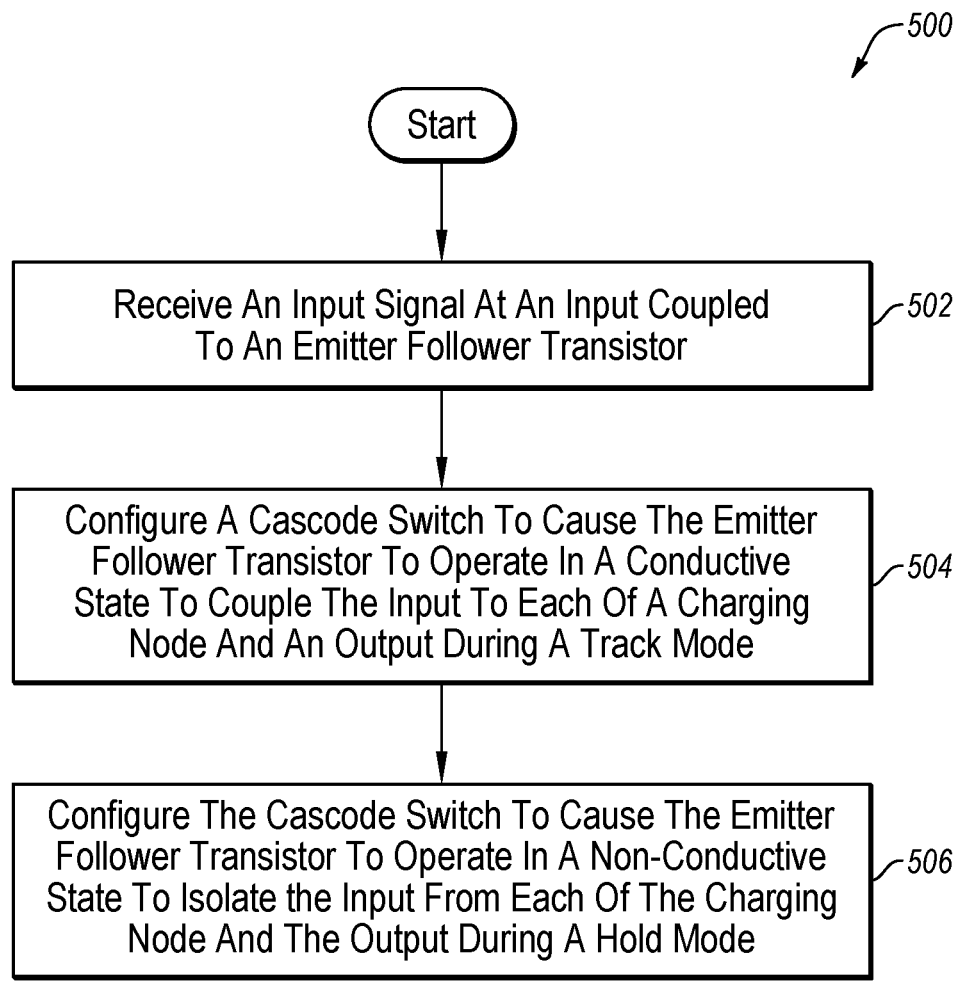
FIG. 6 is a flowchart illustrating an example method of operating a track and hold amplifier.

FIG. 6 is a flowchart of an example method 500 for operating a track and hold amplifier. Method 500 may be performed by any suitable system, apparatus, or device. For example, THA 102, THA core 150, THA 300, optical receiver 400 (see FIGS. 1, 2, 4, and/or 5) or one or more of the components thereof may perform one or more of the operations associated with method 500. Although illustrated as discrete blocks, various blocks may be divided into additional blocks, combined into fewer blocks, or eliminated, depending on the desired implementation. In these and other embodiments, program instructions stored on a computer readable medium may be executed to perform one or more of the operations of method 500.

At block 502, an input signal may be received at an input coupled to an emitter follower transistor, and method 500 may proceed to block 504. For example, an input signal may be received at input InN, which is coupled to emitter follower transistor Q1 of THA core 150 (see FIG. 2).

At block 504, a cascode switch may be configured to cause the emitter follower transistor to operate in a conductive state to couple the input to each of a charging capacitor and an output during a track mode, and method 500 may proceed to block 506. For example, MOS-HBT cascode switch 311 (see FIG. 2) may be configured to cause emitter follower transistor Q1 to operate in a conductive state to couple input InN to each of charging capacitor C1 and output OutN during the track mode.

At block 506, the cascode switch may be configured to cause the emitter follower transistor to operate in a non-conductive state to isolate the input from each of the charging capacitor and the output during a hold mode. For example, MOS-HBT cascode switch 311 (see FIG. 2) may be configured to cause emitter follower transistor Q1 to operate in a non-conductive state to isolate input InN from each of charging capacitor C1 and output OutN during the hold mode.

Modifications, additions, or omissions may be made to method 500 without departing from the scope of the present disclosure. For example, the operations of method 500 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Various embodiments, as disclosed herein, relate to MOS-HBT cascode switches biased as a quasi-CML stage, which may provide high switching speed from a low voltage supply. In contrast to conventional devices, a switched output buffer may not be required.

Compared to an HBT-cascode, a MOS-HBT switch, as disclosed herein, may operate without a current tail source and minimize clock feedthrough without degrading the sampling rate. In at least one non-limiting embodiment, 55 nm MOSFETs may be biased in class AB at a drain current density of approximately 0.2 mA/µm and may swing from substantially 0 up to substantially 0.4 mA/µm. An HBT collector current density per emitter length may swing from substantially 0 to substantially 2 mA/µm. By replacing a HBT and a current tail in a switch with a MOSFET, a supply voltage may be reduced to approximately 2.5 V compared to other designs, resulting in a power consumption of substantially 30 mW for an input buffer and a THA core. Power consumption may be further reduced (e.g., in half) with smaller THA core transistors and currents.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In the present disclosure, a "computing entity" may be any computing system as previously defined in the present disclosure, or any module or combination of modulates running on a computing system.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A device, comprising:
   an emitter follower transistor coupled to each of an input and an output;
   a charging node coupled between the output and a voltage supply, the charging node further coupled between a collector and an emitter of the emitter follower transistor; and
   a cascode switch including a first path coupled to the input and a second path coupled to the output, wherein each of the first and second paths includes a bipolar transistor and a field-effect transistor (FET), and wherein the first path and the second path are substantially symmetrical and respectively electrically passively couple the input and the output to a common node, the cascode switch configured to:
      cause the emitter follower transistor to operate in a conductive state and charge the charging node during a track mode; and
      cause the emitter follower transistor to operate in a non-conductive state to isolate the charging node from the input during a hold mode.

2. The device of claim 1, the cascode switch comprising:
   a first bipolar transistor coupled to the input;
   a second bipolar transistor coupled to the output and the first bipolar transistor;
   a first field-effect transistor (FET) coupled to the first bipolar transistor and configured to receive a hold signal during the hold mode; and
   a second FET coupled to the second bipolar transistor and configured to receive a track signal during the track mode.

3. The device of claim 2, wherein a gate of the first FET is configured to receive a track signal to cause the first FET to operate in a conductive state during the track mode.

4. The device of claim 2, wherein a gate of the second FET is configured to receive a hold signal to cause the second FET to operate in a conductive state during the hold mode.

5. The device of claim 1, further comprising an input buffer coupled to the input.

6. The device of claim 1, further comprising:
a second emitter follower transistor coupled to each of the input and the output;
a second charging node coupled to the output, the charging node further coupled to the input via the second emitter follower transistor; and
a second cascode switch coupled to each of the input and the output and configured to:
cause the second emitter follower transistor to operate in a conductive state and charge the second charging node during the track mode; and
cause the second emitter follower transistor to operate in a non-conductive state to isolate the second charging node from the input during the hold mode.

7. The device of claim 1, further comprising at least one feedforward capacitor coupled to the output.

8. The device of claim 1, wherein the cascode switch comprises a metal-oxide-semiconductor-heterojunction bipolar transistor (MOS-HBT) cascode switch.

9. An optical receiver, comprising:
an analog-to-digital converter (ADC); and
a track and hold amplifier (THA) coupled to the ADC and including:
an emitter follower transistor coupled to each of an input of the THA and an output of the THA;
a charging node coupled between the output and a voltage supply, the charging node further coupled between a collector and an emitter of the emitter follower transistor; and
a cascode switch including a first path coupled to the input and a second path coupled to the output, wherein each of the first and second paths includes a bipolar transistor and a field-effect transistor (FET), and wherein the first path and the second path are substantially symmetrical and respectively electrically passively couple the input and the output to a common node, the cascode switch configured to:
cause the emitter follower transistor to operate in a conductive state and charge the charging node during a track mode; and
cause the emitter follower transistor to operate in a non-conductive state to isolate the charging node from the input during a hold mode.

10. The optical receiver of claim 9, the cascode switch comprising:
a first bipolar transistor coupled to the input;
a second bipolar transistor coupled to the output and the first bipolar transistor;
a first field-effect transistor (FET) coupled to the first bipolar transistor and configured to receive a hold signal during the hold mode; and
a second FET coupled to the second bipolar transistor and configured to receive a track signal during the track mode.

11. The optical receiver of claim 10, wherein a gate of the first FET is configured to receive a track signal to cause the first FET to operate in a conductive state during the track mode.

12. The optical receiver of claim 10, wherein a gate of the second FET is configured to receive a hold signal to cause the second FET to operate in a conductive state during the hold mode.

13. The optical receiver of claim 9, further comprising an input buffer coupled to the input of the THA.

14. The optical receiver of claim 9, further comprising:
a second emitter follower transistor coupled to each of the input and the output;
a second charging node coupled to the output, the second charging node further coupled to the input via the second emitter follower; and
a second cascode switch coupled to each of the input and the output and configured to:
cause the second emitter follower transistor to operate in a conductive state and charge the second charging node during the track mode; and
cause the second emitter follower transistor to operate in a non-conductive state to isolate the second charging node from the input during the hold mode.

15. The optical receiver of claim 9, further comprising at least one feedforward capacitor coupled to the output of the THA.

16. A device, comprising:
a plurality of emitter follower transistors, each emitter follower transistor of the plurality of emitter follower transistors coupled to each of an input and an output;
a plurality of charging nodes coupled to the output, each charging node of the plurality of charging nodes further coupled between a collector and an emitter of at least one emitter follower transistor of the plurality of emitter follower transistors; and
a plurality of cascode switches, each cascode switch of the plurality of cascode switches including a first path coupled to the input and a second path coupled to the output, wherein each of the first and second paths includes a bipolar transistor and a field-effect transistor (FET), and wherein the first path and the second path are substantially symmetrical and respectively electrically passively couple the input and the output to a common node, each cascode switch configured to:
cause an emitter follower transistor of the plurality of emitter follower transistors to operate in a conductive state and charge a charging node of the plurality of charging nodes during a track mode; and
cause the emitter follower transistor to operate in a non-conductive state to isolate the charging node from the input during a hold mode.

17. The device of claim 16, further comprising an input buffer coupled to the input.

18. The device of claim 16, wherein each cascode switch of the plurality of cascode switches comprises:
a first bipolar transistor coupled to the input;
a second bipolar transistor coupled to the output and the first bipolar transistor;
a first field-effect transistor (FET) coupled to the first bipolar transistor and configured to receive a hold signal during the hold mode; and
a second FET coupled to the second bipolar transistor and configured to receive a track signal during the track mode.

19. A method, comprising:
receiving an input signal at an input coupled to an emitter follower transistor including a charging node coupled between a collector and an emitter of the emitter follower transistor;

configuring a cascode switch to have a first path coupled to the input and a second path coupled to an output, wherein each of the first and second paths includes a bipolar transistor and a field-effect transistor (FET), and wherein the first path and the second path are substantially symmetrical, and electrically passively coupling the input and the output to a common node to cause the emitter follower transistor to operate in a conductive state to couple the input to each of a charging node and the output during a track mode; and configuring the cascode switch to cause the emitter follower transistor to operate in a non-conductive state to isolate the input from each of the charging node and the output during a hold mode.

20. The method of claim 19, wherein receiving an input signal comprises receiving the input signal from an input buffer.

\* \* \* \* \*